United States Patent
Wu et al.

(10) Patent No.: US 8,624,531 B2
(45) Date of Patent: Jan. 7, 2014

(54) METHOD AND SYSTEM FOR EVALUATING ELECTRICAL CONNECTIONS BETWEEN A MOTOR CONTROLLER AND MOTOR

(75) Inventors: Long Wu, Fargo, ND (US); Robert Shaw, Moorhead, MN (US); Alan K. Gilman, West Fargo, ND (US)

(73) Assignee: Deere & Company, Moline, IL (US)

( * ) Notice: Subject to any disclaimer, the term of this patent is extended or adjusted under 35 U.S.C. 154(b) by 329 days.

(21) Appl. No.: 13/170,214

(22) Filed: Jun. 28, 2011

(65) Prior Publication Data

US 2012/0217921 A1  Aug. 30, 2012

Related U.S. Application Data

(60) Provisional application No. 61/446,119, filed on Feb. 24, 2011.

(51) Int. Cl.
*H02P 21/00* (2006.01)

(52) U.S. Cl.
USPC ........................ 318/400.02; 318/710; 318/567

(58) Field of Classification Search
USPC ............ 318/400.02, 719, 567, 773, 783, 787, 318/488, 490
See application file for complete search history.

(56) References Cited

U.S. PATENT DOCUMENTS

| | | | |
|---|---|---|---|
| 4,023,083 A | 5/1977 | Plunkett | |
| 4,814,677 A | 3/1989 | Plunkett | |
| 5,428,283 A | 6/1995 | Kalman et al. | |
| 5,486,748 A | 1/1996 | Konrad et al. | |
| 5,914,582 A | 6/1999 | Takamoto et al. | |
| 6,275,000 B1 | 8/2001 | Nishimura | |
| 7,045,988 B2 | 5/2006 | Ha et al. | |
| 7,157,878 B2 | 1/2007 | Collier-Hallman | |
| 7,733,044 B2 | 6/2010 | Nakamura et al. | |
| 2006/0247829 A1 | 11/2006 | Sato | |
| 2010/0188033 A1 | 7/2010 | Daboussi et al. | |
| 2012/0319629 A1 * | 12/2012 | Takaki et al. | 318/400.02 |

OTHER PUBLICATIONS

Elbuluk, Malik E. et al. Speed Sensorless Induction Motor Drives for Electrical Actuators: Schemes, Trends and Tradeoffs. NASA Technical Memorandum 107466. Retrieved from the Internet:<URL:http://www.esat.kuleuven.be/electa/publications/fulltexts/pub_479.pdf>, Jul. 1997.
Van Haute, S. et al. Design and Control of a Permanent Magnet Synchronous Motor Drive for a Hybrid Electric Vehicle. Retrieved from the Internet:<http://www.esat.kuleuven.be/electa/publications/fulltexts/pub_444.pdf>, Sep. 1997.
US 7,595,604, 09/2009, Tomigashi (withdrawn)

* cited by examiner

*Primary Examiner* — Karen Masih

(57) ABSTRACT

A pair of direct d-q-axis voltage commands is associated with a monotonically varying test sequence of test rotor angular positions to determine a correct rotational direction of a rotor of the motor in response to application of the pair of direct d-q-axis voltage commands to the motor. The rotor of the motor rotates (e.g., self spins in a diagnostic mode) in response to the applied direct d-q-axis voltage commands and applied monotonically varying test sequence of test rotor angular positions. The primary positioning module or data processor determines that conductor connections between the inverter (e.g., motor controller) and the motor are correct if the calculated shaft speed sign is positive with respect to an applied monotonically varying test sequence of rotor angular positions that monotonically increases.

18 Claims, 4 Drawing Sheets

METHOD AND SYSTEM FOR EVALUATING ELECTRICAL CONNECTIONS BETWEEN A MOTOR CONTROLLER AND MOTOR

This document claims priority based on U.S. provisional application Ser. No. 61/446,119, filed on 24 Feb. 2011 and entitled METHOD AND SYSTEM FOR EVALUATING ELECTRICAL CONNECTIONS BETWEEN AN MOTOR CONTROLLER AND MOTOR, under 35 U.S.C. 119(e).

FIELD OF THE INVENTION

This invention relates to a method and system for evaluating electrical connections (e.g., or testing for the proper sequence or interconnection of wiring for motor phase leads) between a motor controller and motor.

BACKGROUND OF THE INVENTION

An electric motor may comprise an interior permanent magnet (IPM) motor or an IPM synchronous motor, or a multi-phase alternating current motor. During assembly, repair or field diagnosis, it can be difficult to determine efficiently and quickly whether the electrical connections between a motor or multi-phase motor and the motor controller (e.g., inverter) are correct. In the prior art, the phase sequence connection is sometimes checked by first rotating the motor (e.g., with terminals designed $V_a$, $V_b$ and $V_c$), with a test motor and, second, by observing the back electromotive force (back-EMF) generated between pairs of the electrical terminals (e.g., $V_{ab}$ and $V_{cb}$) via an oscilloscope, power analyzer or other applicable instrument. Third, while the test motor rotates the motor in the forward direction, the back-EMF generated between terminals $V_{cb}$ shall lead the back-EMF generated between terminals $V_{ab}$ by about a 60 degree phase shift. Fourth, while the test motor rotates the motor in the forward direction, the back-EMF generated between terminals $V_{cb}$ shall lag the back-EMF generated between terminals $V_{ab}$ by about a 60 degree phase shift. Fifth, the evaluator determines that the motor is properly connected to the motor controller if the above phase shifts are observed. Thus, there is a need for a simplified diagnostic test procedure, without the use of an oscilloscope or test motor, which can be incorporated into the motor controller or inverter to evaluate the correctness of electrical connections between the motor controller and motor.

SUMMARY OF THE INVENTION

In accordance with one embodiment, a method and system is presented for evaluating electrical connections between a motor controller and motor. For example, a method and system is presented for determining whether a multi-phase motor is properly connected to an inverter with respect to a phase leads sequence. In a diagnostic mode, a data processor, a diagnostic computer, or d-q axis current generation manager establishes or provides a monotonically varying test sequence of test rotor angular positions associated with application of corresponding pairs of direct d-q-axis voltage commands to the motor. Each of the pairs of direct d-q axis voltage commands comprises a direct-axis command and a quadrature-axis command. The data processor or pulse width modulation generation module converts or transforms the direct d-q-axis voltage commands into three phase voltages for each corresponding input phase terminal of the multi-phase motor. The pulse width modulation generation module or the inverter switching circuit processes the direct d-q-axis voltage commands, or derivative multi-phase control voltages, as modulated signals for application to each corresponding input phase terminal. The rotor of the motor rotates (e.g., self spins in a diagnostic mode) in response to the application of the direct d-q-axis voltage commands associated with the corresponding established monotonically varying test sequence of test rotor angular positions. The primary positioning module, the data processor, or the diagnostic computer determines that conductor connections between the inverter and the motor are correct if the calculated shaft speed sign is positive with respect to an applied monotonically varying test sequence of rotor angular positions that monotonically increases, or if a calculated shaft speed sign is negative in response to the application of the direct d-q-axis voltage commands associated with the monotonically varying test sequence of rotor angular positions that monotonically decreases.

DESCRIPTION OF THE PREFERRED EMBODIMENT

Figure 1:
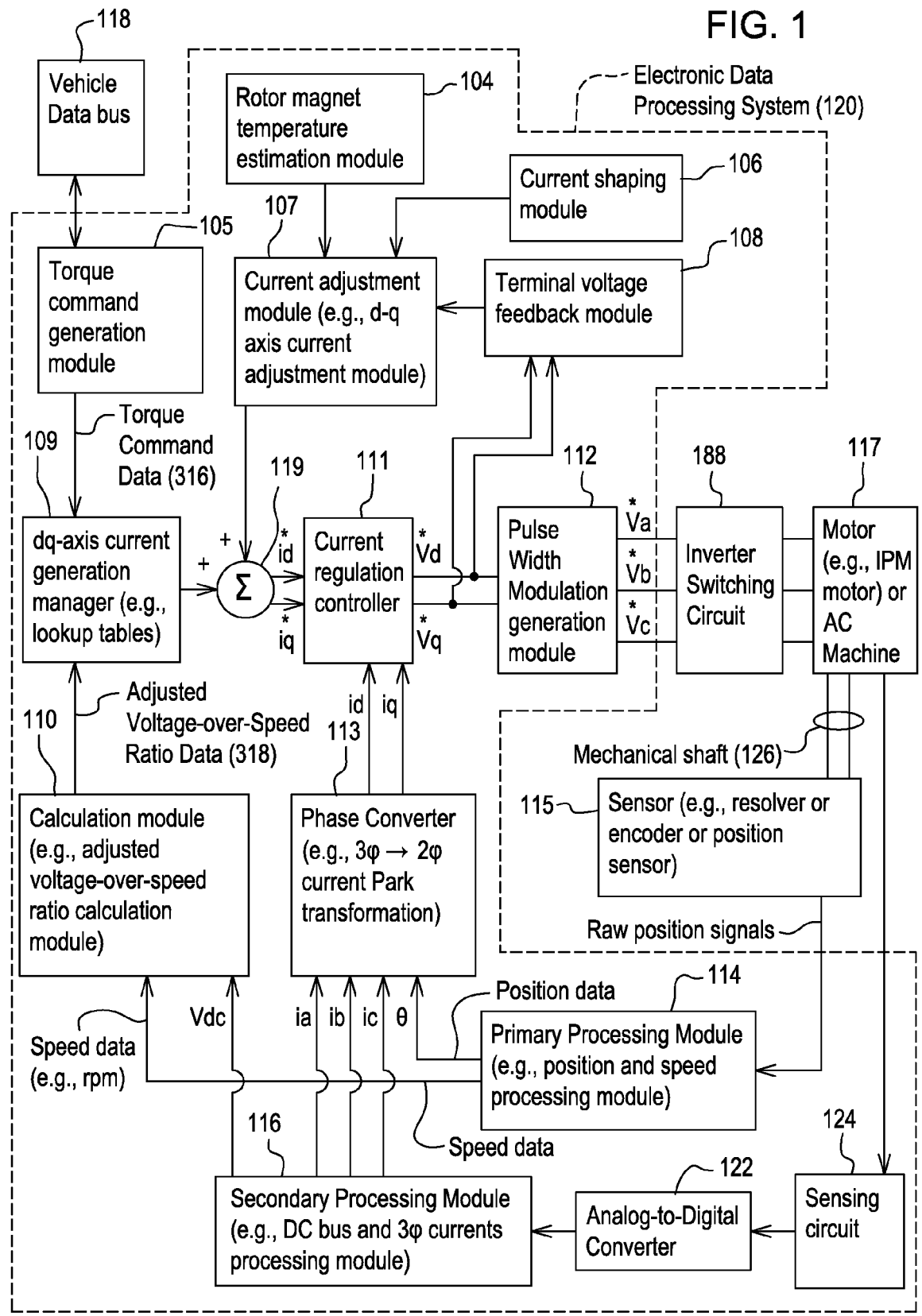
FIG. 1 is a block diagram of one embodiment of a system for evaluating electrical connections between a motor controller and motor.

In accordance with one embodiment, FIG. 1 discloses system for controlling a motor 117 (e.g., an interior permanent magnet (IPM) motor) or another alternating current machine. In one embodiment, the system, aside from the motor 117, may be referred to as an inverter or a motor controller.

The system comprises electronic modules, software modules, or both. In one embodiment, the motor controller comprises an electronic data processing system 120 to support storing, processing or execution of software instructions of one or more software modules. The electronic data processing system 120 is indicated by the dashed lines in FIG. 1 and is shown in greater detail in FIG. 2.

The data processing system 120 is coupled to an inverter circuit 188. The inverter circuit 188 comprises a semiconductor drive circuit that drives or controls switching semiconductors (e.g., insulated gate bipolar transistors (IGBT) or other power transistors) to output control signals for the motor 117. In turn, the inverter circuit 188 is coupled to the motor 117. The motor 117 is associated with a sensor 115 (e.g., a position sensor, a resolver or encoder position sensor) that is associated with the motor shaft 126 or the rotor. The sensor 115 and the motor 117 are coupled to the data processing system 120 to provide feedback data (e.g., current feedback data, such as $i_a$, $i_b$, $i_c$), raw position signals, among other possible feedback data or signals, for example. Other possible feedback data includes, but is not limited to, winding temperature readings, semiconductor temperature readings of the inverter circuit 188, three phase voltage data, or other thermal or performance information for the motor 117.

In one embodiment, the torque command generation module 105 is coupled to a d-q axis current generation manager 109 (e.g., d-q axis current generation look-up tables). D-q axis current refers to the direct axis current and the quadrature axis current as applicable in the context of vector-controlled alternating current machines, such as the motor 117. The output of the d-q axis current generation manager 109 and the output of a current adjustment module 107 (e.g., d-q axis current adjustment module 107) are fed to a summer 119. In turn, one or more outputs (e.g., direct axis current data ($i_d^*$) and quadrature axis current data ($i_q^*$)) of the summer 119 are provided or coupled to a current regulation controller 111.

The current regulation controller 111 is capable of communicating with the pulse-width modulation (PWM) generation module 112 (e.g., space vector PWM generation module). The current regulation controller 111 receives respective d-q axis current commands (e.g., $i_d^*$ and $i_q^*$) and actual d-q axis currents (e.g., $i_d$ and $i_q$) and outputs corresponding d-q axis voltage commands (e.g., $v_d^*$ and $v_q^*$ commands) for input to the PWM generation module 112.

In one embodiment, the PWM generation module 112 converts the direct axis voltage and quadrature axis voltage data from two phase data representations into three phase representations (e.g., three phase voltage representations, such as $v_a^*$, $v_b^*$ and $v_c^*$) for control of the motor 117, for example. Outputs of the PWM generation module 112 are coupled to the inverter 188.

The inverter circuit 188 comprises power electronics, such as switching semiconductors to generate, modify and control pulse-width modulated signals or other alternating current signals (e.g., pulse, square wave, sinusoidal, or other waveforms) applied to the motor 117. The PWM generation module 112 provides inputs to a driver stage within the inverter circuit 188. An output stage of the inverter circuit 188 provides a modulated signal, a pulse-width modulated signal, a pulse-width modulated voltage waveform, a voltage signal or other alternating current signal for control of the motor. In one embodiment, the inverter 188 is powered by a direct current (DC) voltage bus.

The motor 117 is associated with a sensor 115 (e.g., a resolver, encoder, speed sensor, or a position sensor or sensors) that estimates at least one of an angular position of the motor shaft 126, a speed or velocity of the motor shaft 126, and a direction of rotation of the motor shaft 126. The sensor 115 may be mounted on or integral with the motor shaft 126. The output of the sensor 115 is capable of communication with the primary processing module 114 (e.g., position and speed processing module). In one embodiment, the sensor 115 may be coupled to an analog-to-digital converter (not shown) that converts analog position data or velocity data to digital position or velocity data, respectively. In other embodiments, the sensor 115 (e.g., digital position encoder) may provide a digital data output of position data or velocity data for the motor shaft 126 or rotor.

A first output (e.g., position data and speed data for the motor 117) of the primary processing module 114 is communicated to the phase converter 113 (e.g., three-phase to two-phase current Park transformation module) that converts respective three-phase digital representations of measured current into corresponding two-phase digital representations of measured current. A second output (e.g., speed data) of the primary processing module 114 is communicated to the calculation module 110 (e.g., adjusted voltage over speed ratio module).

An input of a sensing circuit 124 is coupled to terminals of the motor 117 for sensing at least the measured three-phase currents and a voltage level of the direct current (DC) bus (e.g., high voltage DC bus which may provide DC power to the inverter circuit 188). An output of the sensing circuit 124 is coupled to an analog-to-digital converter 122 for digitizing the output of the sensing circuit 124. In turn, the digital output of the analog-to-digital converter 122 is coupled to the secondary processing module 116 (e.g., Direct current (DC) bus and three phase current processing module). For example, the sensing circuit 124 is associated with the motor 117 for measuring three phase currents (e.g., current applied to the windings of the motor 117, back EMF induced into the windings, or both).

Certain outputs of primary processing module 114 and the secondary processing module 116 feed the phase converter 113. For example, the phase converter 113 may apply a Park transformation or other conversion equations (e.g., certain conversion equations that are suitable are known to those of ordinary skill in the art) to convert the measured three-phase representations of current into two-phase representations of current based on the digital three-phase current data from the secondary processing module 116 and position data from the sensor 115. The output of the phase converter 113 module is coupled to the current regulation controller 111.

Other outputs of the primary processing module 114 and the secondary processing module 116 may be coupled to inputs of the calculation module 110 (e.g., adjusted voltage over-speed ratio calculation module). For example, the primary processing module 114 may provide speed data (e.g., motor shaft 126 revolutions per minute), whereas the secondary processing module 116 may provide a measured level of direct current voltage (e.g., on the direct current (DC) bus of a vehicle). The direct current voltage level on the DC bus that supplies the inverter circuit 188 with electrical energy may fluctuate or vary because of various factors, including, but not limited to, ambient temperature, battery condition, battery charge state, battery resistance or reactance, fuel cell state (if applicable), motor load conditions, respective motor torque and corresponding operational speed, and vehicle electrical loads (e.g., electrically driven air-conditioning compressor). The calculation module 110 is connected as an intermediary between the secondary processing module 116 and the dq-axis current generation manager 109. The output of the calculation module 110 can adjust or impact current commands generated by the d-q axis current generation manager 109 to compensate for fluctuation or variation in direct current bus voltage, among other things.

The rotor magnet temperature estimation module 104, the current shaping module 106, and the terminal voltage feedback module 108 are coupled to or are capable of communicating with the dq-axis current adjustment module 107. In turn, the d-q axis current module 107 may communicate with the dq-axis current generation manager or the summer 119.

The rotor magnet temperature module 104 estimates or determines the temperature of the rotor permanent magnet or magnets. In one embodiment, the rotor magnet temperature estimation module 104 may estimate the temperature of the rotor magnets from internal control variables calculation, or from one or more sensors located on the stator, in thermal communication with the stator, or secured to the housing of the motor 117.

In another alternative embodiment, the rotor magnet temperature estimation module 104 may be replaced with a temperature detector (e.g., a thermistor or infrared thermal sensor coupled to a wireless transmitter) mounted on the rotor or the magnet, where the detector provides a signal (e.g., wireless signal) indicative of the temperature of the magnet or magnets.

In one embodiment, the method or system may operate in the following manner. The torque command generation module 105 receives an input control data message, such as a speed control data message, a voltage control data message, or a torque control data message, over a vehicle data bus 118.

The torque command generation module 105 converts the received input control message into torque control command data 316.

The d-q axis current generation manager 109 selects or determines the direct axis current command data and the quadrature axis current command data associated with respective torque control command data and respective detected motor shaft 126 speed data. For example, the d-q axis current generation manager 109 selects or determines the direct axis current command, the quadrature axis current command by accessing one or more of the following: (1) a look-up table, database or other data structure that relates respective torque commands to corresponding direct and quadrature axes currents, (2) a set of quadratic equations or linear equations that relate respective torque commands to corresponding direct and quadrature axes currents, or (3) a set of rules (e.g., if-then rules) that relates respective torque commands to corresponding direct and quadrature axes currents. The sensor 115 on the motor 117 facilitates provision of the detected speed data for the motor shaft 126, where the primary processing module 114 may convert position data provided by the sensor 115 into speed data.

The current adjustment module 107 (e.g., d-q axis current adjustment module) provides current adjustment data to adjust the direct axis current command data and the quadrature axis current command data based on input data from the rotor magnet temperature estimation module 104, the current shaping module 106, and the terminal voltage feedback module 108.

The current shaping module 106 may determine a correction or preliminary adjustment of the quadrature axis (q-axis) current command and the direct axis (d-axis) current command based on one or more of the following factors: torque load on the motor 117 and speed of the motor 117, for example. The rotor magnet temperature estimation module 104 may generate a secondary adjustment of the q-axis current command and the d-axis current command based on an estimated change in rotor temperature, for example. The terminal voltage feedback module 108 may provide a third adjustment to d-axis and q-axis current based on control voltage command versus voltage limit. The current adjustment module 107 may provide an aggregate current adjustment that considers one or more of the following: a preliminary adjustment, a secondary adjustment, and a third adjustment.

In one embodiment, the motor 117 may comprise an interior permanent magnet machine (IPM) machine or an IPM synchronous machine (IPMSM). An IPMSM has many favorable advantages compares with conventional induction machines or surface mounted PM machines (SMPM) such as high efficiency, high power density, wide constant power operating region, maintenance free, for instance.

The sensor 115 (e.g., shaft or rotor speed detector) may comprise one or more of the following: a direct current motor, an optical encoder, a magnetic field sensor (e.g., Hall Effect sensor), magneto-resistive sensor, and a resolver (e.g., a brushless resolver). In one configuration, the sensor 115 comprises a position sensor, where position data and associated time data are processed to determine speed or velocity data for the motor shaft 126. In another configuration, the sensor 115 comprises a speed sensor, or the combination of a speed sensor and an integrator to determine the position of the motor shaft.

In yet another configuration, the sensor 115 comprises an auxiliary, compact direct current generator that is coupled mechanically to the motor shaft 126 of the motor 117 to determine speed of the motor shaft 126, where the direct current generator produces an output voltage proportional to the rotational speed of the motor shaft 126. In still another configuration, the sensor 115 comprises an optical encoder with an optical source that transmits a signal toward a rotating object coupled to the shaft 126 and receives a reflected or diffracted signal at an optical detector, where the frequency of received signal pulses (e.g., square waves) may be proportional to a speed of the motor shaft 126. In an additional configuration, the sensor 115 comprises a resolver with a first winding and a second winding, where the first winding is fed with an alternating current, where the voltage induced in the second winding varies with the frequency of rotation of the rotor.

Figure 2:
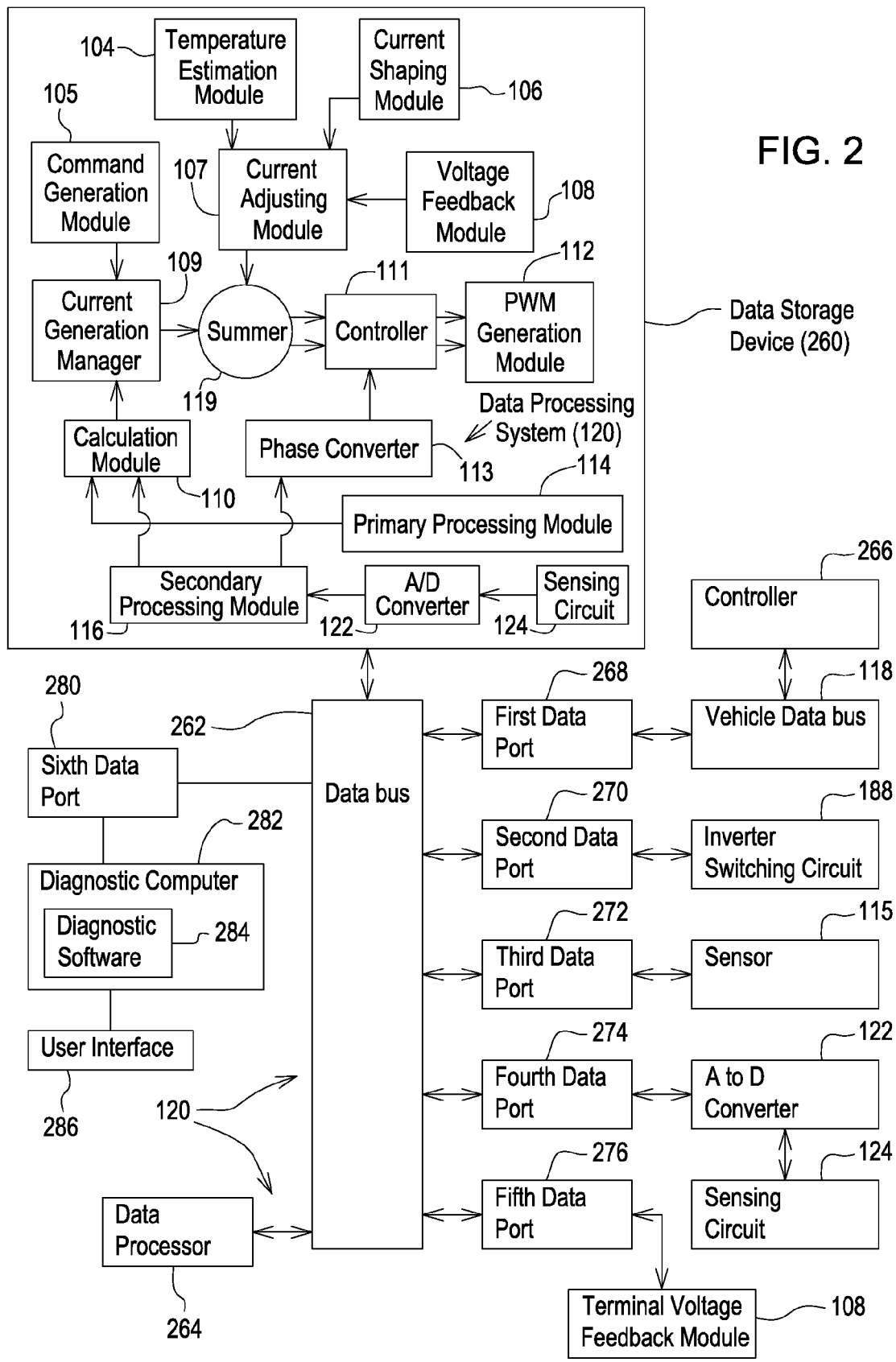
FIG. 2 is a block diagram of an electronic data processing system consistent with FIG. 1.

In FIG. 2, the electronic data processing system 120 comprises an electronic data processor 264, a data bus 262, a data storage device 260, and one or more data ports (268, 270, 272, 274, 276 and 280). The data processor 264, the data storage device 260 and one or more data ports are coupled to the data bus 262 to support communications of data between or among the data processor 264, the data storage device 260 and one or more data ports.

In one embodiment, the data processor 264 may comprise one or more of the following electronic components: an electronic data processor, a microprocessor, a microcontroller, a programmable logic array, a field programmable gate array (FPGA), a logic circuit, an arithmetic logic unit, an application specific integrated circuit, a digital signal processor (DSP), a proportional-integral-derivative (PID) controller, or another data processing device. The above electronic components may be interconnected via one or more data buses, parallel data buses, serial data buses, or any combination of parallel and serial data buses, for example.

The data storage device 260 may comprise any magnetic, electronic, or optical device for storing data. For example, the data storage device 260 may comprise an electronic data storage device, an electronic memory, non-volatile electronic random access memory, one or more electronic data registers, data latches, a magnetic disc drive, a hard disc drive, an optical disc drive, or the like.

As shown in FIG. 2, the data ports comprise a first data port 268, a second data port 270, a third data port 272, a fourth data port 274, a fifth data port 276, and a sixth data port 280; although any suitable number of data ports may be used. Each data port may comprise a transceiver and buffer memory, for example. In one embodiment, each data port may comprise any serial or parallel input/output port.

In one embodiment as illustrated in FIG. 2, the first data port 268 is coupled to the vehicle data bus 118. In turn, the vehicle data bus 118 is coupled to the controller 266. In one configuration, the second data port 270 may be coupled to the inverter circuit 188; the third data port 272 may be coupled to the sensor 115; the fourth data port 274 may be coupled to the analog-to-digital converter 122; the fifth data port 276 may be coupled to the terminal voltage feedback module 108; and the sixth data port 280 is coupled to the diagnostic computer 282. The diagnostic computer 282 comprises diagnostic software 284 that is executable by a computer data processor. The diagnostic computer 282 is coupled to a user interface 286. The user interface 286 comprises one or more of the following: a keyboard, a display, a pointing device (e.g., electronic mouse), a switch, a keypad, or another device that supports entering, inputting, manipulating, or outputting data into, within or from the computer 282. The analog-to-digital converter 122 is coupled to the sensing circuit 124.

In one embodiment of the data processing system 120, the torque command generation module 105 is associated with or supported by the first data port 268 of the electronic data processing system 120. The first data port 268 may be coupled to a vehicle data bus 118, such as a controller area network (CAN) data bus. The vehicle data bus 118 may provide data bus messages with torque commands to the torque command generation module 105 via the first data port 268. The operator of a vehicle may generate the torque commands via a user interface, such as a throttle, a pedal, a controller 266, or other control device.

In certain embodiments, the sensor 115 and the primary processing module 114 may be associated with or supported by a third data port 272 of the data processing system 120.

Figure 3:
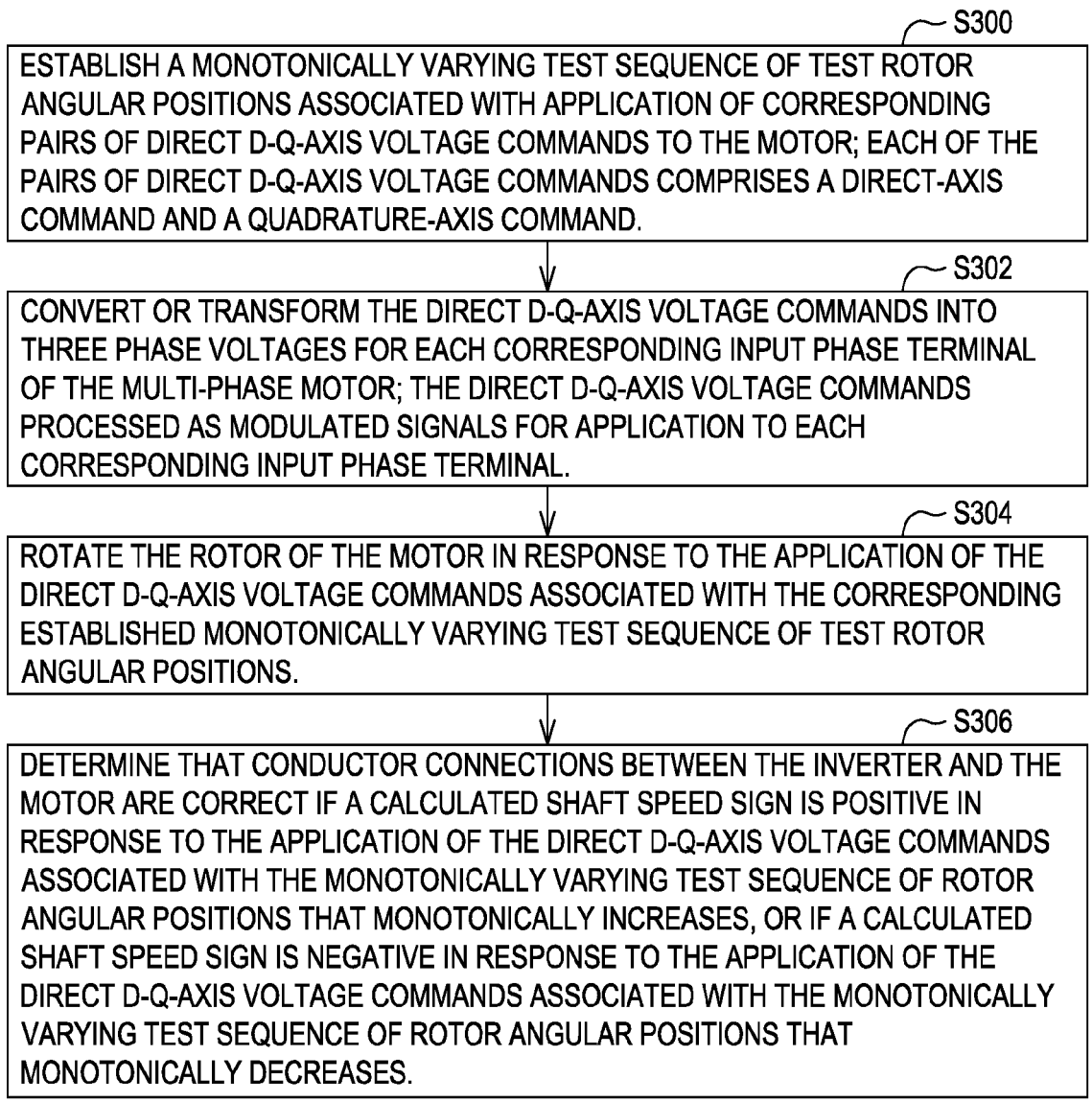
FIG. 3 is a flow chart of a first example of a method for evaluating electrical connections between a motor controller and motor.

FIG. 3 discloses a method for evaluating electrical connections between a motor (e.g., 117) controller and motor (e.g., 117), and more particularly, a method for determining whether a multi-phase motor (e.g., 117) is properly connected to an inverter. The method of FIG. 3 begins in step S300.

In step S300, a data processor 264, pulse width modulation generation module 112, or diagnostic computer 282 establishes a monotonically varying test sequence of test rotor angular positions associated with the application of corresponding pairs of direct d-q axis (or d-q axes) voltage commands to the motor (e.g., 117). Each of the pairs of direct d-q axis voltage commands comprises a direct-axis voltage command and a quadrature axis voltage command. A monotonically varying test sequence may comprise a monotonically increasing test sequence of test rotor angular positions or a monotonically decreasing test sequence of test rotor angular positions. Monotonically increasing means one or more of the following: continuously increasing, increasing without material interruption, increasing in discrete steps, increasing with pauses or periodic pauses in the increase, or increasing without any material decreases. Monotonically decreasing means one or more of the following: continuously decreasing, decreasing without material interruption, decreasing in discrete steps, decreasing with pauses or periodic pauses in the increase, or decreasing without any material increases.

Step S300 may be executed in accordance with various procedures that are applied alternately or cumulatively. Under a first procedure for executing step S300, a data processor 264, pulse width modulation generation module 112, or diagnostic computer 282 establishes or provides respective pairs of direct dq-axis voltage commands corresponding to a monotonically varying test sequence of test rotor angular positions for a diagnostic mode or test mode of the inverter or data processing system 120. In the diagnostic mode, as opposed to the operational mode of the inverter or data processing system 120, the torque command generation module 112 may be disabled (or deactivated) such that the torque command generation module 112 does not receive or act upon torque commands from the vehicle data bus 118 while the data processing system is in the diagnostics mode. Similarly, in the diagnostic mode, as opposed to the operational mode of the inverter or data processing system 120, the current regulation controller 111 or the current regulator may be disabled (or deactivated) such that the current regulation controller 111 is bypassed or does not receive or act upon torque commands from the vehicle data bus 118 while the data processing system 120 is in the diagnostics mode.

Under a second procedure for executing step S300, the current regulation controller 111 or the current regulator may be bypassed in the diagnostics mode such that direct d-q axis voltage commands consistent with the monotonically varying test sequence of test rotor angular positions are generated directly in or at the pulse width modulation generation module 112. Further, in certain embodiments, the pulse width modulation generation module 112 may generate one or more sets or sequences of d-q axis voltage commands or corresponding three phase voltages for test purposes in the diagnostic mode.

Under a third procedure, a diagnostic computer 282 activates, provides, or establishes the direct d-q-axis voltage commands consistent with the monotonically varying test sequence of test rotor angular positions to bypass a current regulation controller 111 or current regulator in a diagnostic mode or a test mode. The diagnostic computer 282 operates diagnostic software 284 stored therein and executable thereby.

Under a fourth procedure, in a diagnostic mode or test mode, the direct d-q-axis voltage commands provided by the diagnostic computer 282 or the pulse width generation modulation generation module 112 are active, as opposed to standard d-q-axis voltage commands ordinarily provided by the current regulation controller 111 during the operational mode. The current regulation controller 111 or current regulator provides a direct-axis current command and quadrature-axis current command in the operational mode.

Under a fifth example, the direct d-q-axis voltage commands associated with monotonically varying rotor angular position change in every pulse width modulation (PWM) cycle in accordance the following equation:

$$\Delta\theta = \frac{\text{initial\_startup\_frequency} * 360°}{\text{PWM\_switching\_frequency}},$$

where $\Delta\theta$ is a change in the rotor position increment or decrement from an earlier pulse-width modulation cycle to a later pulse-width modulation cycle, initial_startup_frequency is within a range of approximately 1 Hz to approximately 10 Hz, and the PWM_switching_frequency is within a range of approximately 1 kHz (kilohertz) to approximately 10 kHz.

Under a sixth procedure, the test sequence of test rotor angular positions may comprise any aligned positions within the following group of aligned positions: approximately 0 degrees, approximately 60 degrees, approximately 120 degrees, approximately 180 degrees, approximately 240 degrees, approximately 300 degrees and approximately 360 degrees, where approximately means plus or minus five degrees. Each of the aligned positions is associated with a different corresponding phase winding current or activation of different combinations or permutations of semiconductors (e.g., power insulated gate bipolar transistors) within the inverter switching circuit 188, for example.

In step S302, the data processor 264 or the pulse width modulation generation module 112 converts and transforms the direct d-q-axis voltage commands into multi-phase voltages (e.g., three phase voltages) for each corresponding input phase terminal of the multi-phase motor (e.g., 117). Further, the direct d-q axis voltage commands are processed as modulated signals (e.g., pulse width modulated signals, square wave signals, or other waveforms) for application to each corresponding input terminal.

In step S304, the data processor 264, the pulse width modulation generation module 112, or the inverter switching circuit 188 rotates the rotor of the motor (e.g., 117) in response to the application of direct d-q-axis voltage commands (after conversion or transformation to respective three phase commands) associated with the corresponding established monotonically varying test sequence of test rotor angular positions. For example, in a field initial position offset calibration procedure, the data processor 264, the pulse width modulation generation module 112, or the diagnostic computer 282 provides or cooperates to provide direct d-q-axis voltage commands and associated monotonically varying test positions for application to respective phase input terminals to rotate the rotor at a known predetermined rotational direction.

In step S306, the data processor 264, or the primary processing module 114, determines whether or not the conductor connections between the inverter and the motor (e.g., 117) are correct. Step S306 may be carried out in accordance with various techniques that may be applied separately or cumulatively. Under a first technique, the data processor 264 or primary processing module 114 determines that the conductor connections between the inverter and the motor (e.g., 117) are correct if the calculated shaft speed sign is positive in response to the application of the direct d-q axis voltage commands associated with a respective monotonically varying test sequence (e.g., monotonically increasing test sequence) of rotor angular positions that monotonically increases.

Under a second technique for carrying out step S306, the data processor 264 or primary processing module 114 determines that conductor connections between the inverter and the motor (e.g., 117) are correct if the calculated shaft speed sign is negative in response to the application of the direct d-q axis voltage commands associated with a respective monotonically varying test sequence (e.g., monotonically decreasing test sequence) of rotor angular positions that decreases.

Under a third technique for executing step S306, the data processor 264 or primary processing module 114 determines that conductor connections between the inverter and the motor (e.g., 117) are incorrect if the calculated shaft speed sign is negative in response to the application of the direct d-q axis voltage commands associated with a respective monotonically varying test sequence (e.g., monotonically increasing test sequence) of rotor angular positions that increases.

Under a fourth technique, the data processor 264 or primary processing module 114 determines that the conductor connections between the motor (e.g., 117) and inverter are incorrect if the calculated shaft speed sign is positive in response to the application of the direct d-q axis voltage commands associated with a respective monotonically varying test sequence (e.g., monotonically decreasing test sequence) of rotor angular positions that monotonically decreases.

Under a fifth technique for executing step S306, the data processor 264, primary processing module 114, or diagnostic computer 282 detects that a variation trend in raw position readings matches a phase sequence connection if the calculated motor (e.g., 117) shaft speed is positive with commanding a monotonically increasing position, and vice versa. Under a sixth technique, the data processor 264, primary processing module 114, or diagnostic computer 282 detects that the variation trend in raw position reading is not matching phase sequence connection if the calculated motor (e.g., 117) shaft speed is positive with commanding monotonically decreasing position, and vice versa.

After or during step S306, the data processor 264 or the primary processing module 114 may report or transmit a data status message to the diagnostic computer 282 via the sixth data port 280, where the data status message contains information on whether the conductor connection between the inverter and the motor is correct or not. The diagnostic computer 284 may display or output the data status message to a user or technician via the user interface 286.

Figure 4:
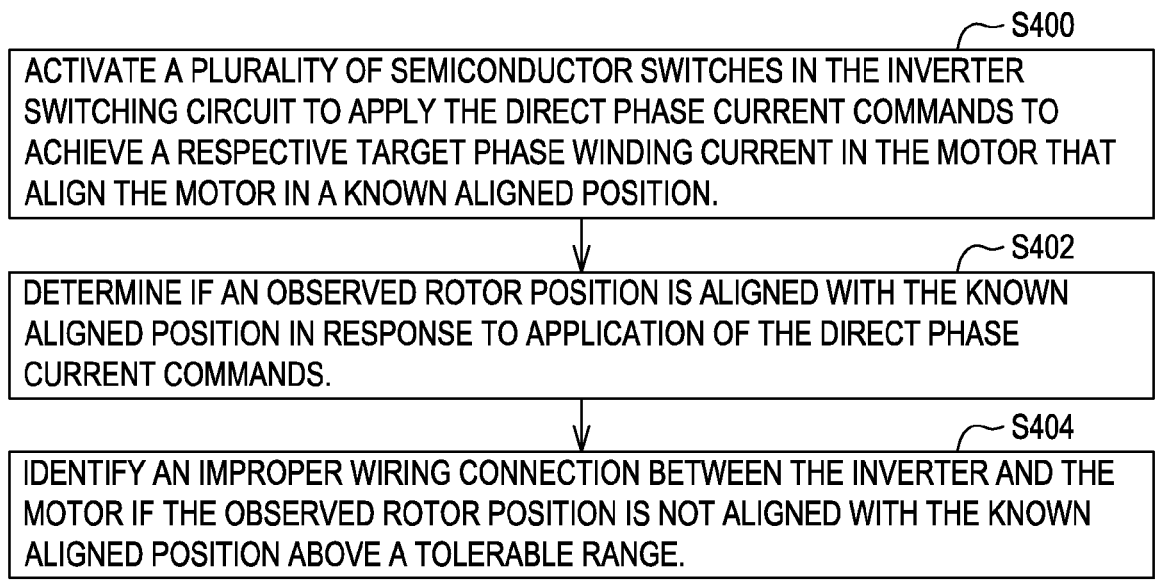
FIG. 4 is a flow chart of a second example of a method for evaluating electrical connections between a motor controller and motor.

FIG. 4 discloses a method for evaluating electrical connections between a motor (e.g., 117) controller and motor (e.g., 117), and more particularly, a method for determining whether a multi-phase motor (e.g., 117) is properly connected to an inverter. The method of FIG. 4 begins in step S400.

In step S400, the diagnostic computer 282, the data processor 264, or the pulse width modulation generation module 112 activates a plurality of semiconductor switches in the inverter switching circuit 188 to apply the direct phase current commands to achieve a respective target phase winding current in the motor (e.g., 117) that aligns the motor (e.g., 117) in a known aligned position. The semiconductor switches may comprise insulated gate bipolar transistors (IGBT's), power transistors, or power field effect transistors (FET's), for example. If the motor (e.g., 117) comprises a multi-phase motor (e.g., 117), the application of each respective direct phase current command can be used to rotate the rotor to a corresponding known aligned position, among a group of possible angular rotor positions. The direct phase current commands are applied one or more windings of the motor (e.g., 117) via the data processor 264 and via the inverter switching circuit 188, for example.

In step S402, the diagnostic computer 282, the data processor 264, of the secondary processing module determines if an observed rotor position is aligned with the known aligned position in response to application of the direct phase current commands. For example, the diagnostic computer 282, the data processor 264, of the secondary processing module determines if each observed rotor position is aligned with the corresponding known aligned position in response to application of a sequence or series of the direct phase current commands.

In step S404, the diagnostic computer 282, identifies an improper wiring connection between the inverter and the motor (e.g., 117) if the observed rotor position is not aligned with the known aligned position above a tolerable range, or for the sequence of the direct phase current commands. For example, if the observed rotor position is approximately 120 degrees and if the known aligned position is approximately 0 or 360 degrees, a first input phase terminal and a second phase input terminal are erroneously interchanged. The tolerable range may be defined as plus or minus 10 degrees of rotation of the rotor, although other tolerable range may be suitable and will fall within the scope of the claims appended hereto.

During assembly, repair or field diagnosis, the above embodiments of the method and system facilitate efficiently and quickly determining whether the electrical connections between a motor or multi-phase motor and the motor controller (e.g., inverter) are correct. In particular, the method and system disclosed herein provides a simplified diagnostic test procedure that can readily be performed in the field or a service facility, without the use of an oscilloscope or test motor, to evaluate the correctness of electrical connections between the motor controller and motor Having described the preferred embodiment, it will become apparent that various modifications can be made without departing from the scope of the invention as defined in the accompanying claims.

The following is claimed:

1. A method for determining whether a multi-phase motor is properly connected to an inverter, the method comprising:
   establishing a monotonically varying test sequence of test rotor angular positions associated with application of corresponding pairs of direct d-q-axis voltage commands to the motor, each of the pairs of direct d-q axis voltage commands comprising a direct-axis command and a quadrature-axis command;
   converting or transforming the direct d-q-axis voltage commands into multiple phase voltages for each corresponding input phase terminal of the multi-phase motor, the direct d-q-axis voltage commands processed as modulated signals for application to each corresponding input phase terminal;

rotating the rotor of the motor in response to the application of the direct d-q-axis voltage commands associated with the corresponding established monotonically varying test sequence of test rotor angular positions; and determining that conductor connections between the inverter and the motor are correct if a calculated shaft speed sign is positive in response to the application of the direct d-q-axis voltage commands associated with the monotonically varying test sequence of rotor angular positions that monotonically increases or if a calculated shaft speed sign is negative in response to the application of the direct d-q-axis voltage commands associated with the monotonically varying test sequence of rotor angular positions that monotonically decreases.

2. The method according to claim 1 wherein the modulated signals comprise pulse width modulation signals.

3. The method according to claim 1 further comprising:
determining that conductor connections between the inverter and the motor are incorrect if the calculated shaft speed sign is negative in response to the application of the direct d-q-axis voltage commands associated with the monotonically varying test sequence of rotor angular positions that monotonically increases.

4. The method according to claim 1 further comprising:
determining that conductor connections between the inverter and the motor are incorrect if the calculated shaft speed sign is positive in response to the application of the direct d-q-axis voltage commands associated with the monotonically varying test sequence of rotor angular positions that monotonically decreases.

5. The method according to claim 1 wherein the direct d-q-axis voltage commands are manually activated by a user to bypass a current regulation controller in a test mode.

6. The method according to claim 1 wherein the direct d-q-axis voltage commands are inactive in an operational mode; and further comprising:
providing, by a current regulation controller, a direct-axis current command and quadrature-axis current command in the operational mode.

7. The method according to claim 1 wherein the direct d-q-axis voltage commands associated with monotonically varying rotor angular position changes in every pulse-width-modulation (PWM) cycle in accordance with the following equation:

$$\Delta\theta = \text{initial\_startup\_frequency} * 360° / \text{PWM\_switching\_frequency},$$

where $\Delta\theta$ is a change in the rotor position increment or decrement from an earlier pulse-width modulation cycle to a later pulse-width modulation cycle, initial_startup_frequency is within a range of approximately 1 Hz to approximately 10 Hz, and the PWM_switching_frequency is within a range of approximately 1 kHz to approximately 10 kHz.

8. The method according to claim 1 further comprising:
in a field initial position offset calibration procedure, issuing direct d-q-axis voltage commands and associated monotonically varying test positions for application to respective phase input terminals to rotate the rotor at a known predetermined rotational direction; and detecting that a variation trend in raw position readings is matching a phase sequence connection between the motor and the inverter if the calculated motor shaft speed is positive with commanding a monotonically increasing position, and vice versa.

9. The method according to claim 8 further comprising:
detecting that the variation trend in raw position reading is not matching phase sequence connection between the motor and the inverter if the calculated motor shaft speed is positive with commanding monotonically decreasing position, and vice versa.

10. A method for determining whether a multi-phase motor is properly connected to an inverter, the method comprising:
activating a plurality of semiconductor switches to apply the direct phase current commands to achieve a respective target phase winding current in the motor that align the motor in a known aligned position;

determining if an observed rotor position is aligned with the known aligned position in response to application of the direct phase current commands; and identifying improper wiring connection between the inverter and the motor if the observed rotor position is not aligned with the known aligned position above a tolerable range.

11. The method according to claim 10 wherein if the observed rotor position is approximately 120 degrees and if the known aligned position is approximately 0 or 360 degrees, a first input phase terminal and a second phase input terminal are erroneously interchanged.

12. A system for determining whether a multi-phase motor is properly connected to an inverter, the system comprising:
a data processor for establishing a monotonically varying test sequence of test rotor angular positions associated with application of corresponding pairs of direct d-q-axis voltage commands to the motor, each of the pairs of direct d-q axis voltage commands comprising a direct-axis command and a quadrature-axis command;

a pulse width modulation generation module for converting or transforming the direct d-q-axis voltage commands into multiple phase voltages for each corresponding input phase terminal of the multi-phase motor;

an inverter switching circuit for processing the direct d-q-axis voltage commands processed as modulated signals for application to each corresponding input phase terminal of the motor;

a rotor of the motor rotated in response to the application of the direct d-q-axis voltage commands associated with the corresponding established monotonically varying test sequence of test rotor angular positions; and the data processor adapted to determine that conductor connections between the inverter and the motor are correct if a calculated shaft speed sign is positive in response to the application of the direct d-q-axis voltage commands associated with the monotonically varying test sequence of rotor angular positions that monotonically increases.

13. The system according to claim 12 wherein the data processor is adapted to determine that the conductor connections between the inverter and the motor are correct if a calculated shaft speed sign is negative in response to the application of the direct d-q-axis voltage commands associated with the monotonically varying test sequence of rotor angular positions that monotonically decreases.

14. The system according to claim 12 wherein the modulated signals comprise pulse width modulation signals.

15. The system according to claim 12 wherein the data processor is adapted to determine that the conductor connections between the inverter and the motor are incorrect if the calculated shaft speed sign is negative in response to the application of the direct d-q-axis voltage commands associated with the monotonically varying test sequence of rotor angular positions that monotonically increases.

16. The system according to claim 12 wherein the data processor is adapted to determine that the conductor connections between the inverter and the motor are incorrect if the calculated shaft speed sign is positive in response to the application of the direct d-q-axis voltage commands associated with the monotonically varying test sequence of rotor angular positions that monotonically decreases.

17. The system according to claim 12 further comprising:
a current regulation controller for generating d-q axis voltage commands in an operational mode; where in a diagnostic mode the direct d-q-axis voltage commands bypass or disable the current regulation controller.

18. The system according to claim 12 wherein the direct d-q-axis voltage commands associated with monotonically varying rotor angular position changes in every pulse-width-modulation (PWM) cycle in accordance with the following equation:

$$\Delta\theta = \text{initial\_startup\_frequency} * 360° / \text{PWM\_switching\_frequency},$$

where $\Delta\theta$ is a change in the rotor position increment or decrement from an earlier pulse-width modulation cycle to a later pulse-width modulation cycle, initial_startup_frequency is within a range of approximately 1 Hz to approximately 10 Hz, and the PWM_switching_frequency is within a range of approximately 1 kHz to approximately 10 kHz.

* * * * *